United States Patent

[15] 3,690,538

[45] Sept. 12, 1972

Gaiser et al.

[54] BONDING TOOL

[72] Inventors: Edward L. Gaiser, Newport Beach; Kenneth W. Ellett, Fountain View, both of Calif.

[73] Assignee: Gaiser Tool Company, Santa Ana, Calif.

[22] Filed: Feb. 25, 1970

[21] Appl. No.: 13,869

[52] U.S. Cl. ........................228/3, 29/470.1, 29/626, 228/1

[51] Int. Cl. ............................B23k 21/00, B23p 3/02

[58] Field of Search ...................228/1, 3, 3.5, 54, 55; 29/470.1, 626

[56] References Cited

UNITED STATES PATENTS

| | | | |
|---|---|---|---|
| 3,468,731 | 9/1969 | Obeda | 228/1 X |
| 3,347,442 | 10/1967 | Reder | 228/3 |
| 2,859,473 | 11/1958 | Warren | 228/55 X |

OTHER PUBLICATIONS

IBM Technical Disclosure Bulletin, Vol. 10, No. 12, May 1968.

*Primary Examiner*—John F. Campbell
*Assistant Examiner*—R. J. Craig
*Attorney*—Nienow & Frater

[57] ABSTRACT

This disclosure relates to tools for use in ultrasonic or thermocompression bonding devices for bonding fine wires on conductive materials, particularly semiconductor devices.

It is characterized by having a concave or cylindrical bonding surface which has an irregular or matte finish for firmly gripping the fine wire to be bonded. The tool is also formed with view relief cutouts on opposite sides of the tool adjacent the bonding surface to enable the operator to clearly view the target area at the bonding surface.

6 Claims, 8 Drawing Figures

INVENTORS.
KENNETH W. ELLETT
EDWARD L. GAISER
BY
Mesnow & Kraten
ATTORNEYS

INVENTORS.
KENNETH W. ELLETT
EDWARD L. GAISER
BY
Nienow & Frater
ATTORNEYS

BONDING TOOL

The present invention relates generally to bonding tools, and more particularly to tools for use in ultrasonic or thermocompression bonding of extremely fine wire to any bondable metallic surface.

The past several decades have seen considerable advancement in the construction and operation of many different types of electronic devices. In fact, during that time many new electronic devices have been devised to perform a myriad of different functions.

Electronics has played an extremely important part in space exploration, what with communications, guidance control and many other necessary functions being dependent upon electronic advancements. However, for space travel, electronic devices must be microminiature such that they consume a minimum amount of space and contribute a minimum amount of weight to the space package. In view of this, extremely sophisticated techniques have been devised for making electronic components of virtually every type and description. Many of these devices require component boards or modules which comprise a plurality of electronic operating stages within a fraction of an inch of space.

Bonding machines have been devised for making such components or modules, which bonding machines are capable of bonding a gold or aluminum wire to one or more points on a substrate or any bondable metallic surface. Such wire is hardly viewable to the naked eye and may be as small as 0.0007 inches in diameter.

The bonding operation is accomplished by the application of energy to the wire and substrate either in the form of ultrasonic vibrations or in the form of heat. Such energy is applied directly to the wire as it rests on the bonding surface.

For a considerable period of time, it has been the desire of operators of bonding machines to have a tool which is capable of bonding more effectively and quickly, while enabling the operator to have a complete view of the bonding target area.

In view of the foregoing, it is an object of the present invention to provide a bonding tool which is capable of bonding more effectively and quickly, while enabling the operator to have a complete view of the target area.

In view of the foregoing, it is an object of the present invention to provide a bonding tool which is capable of effecting stronger and more effective bonds on substrates and bondable metallic surfaces which are not at right angles to the downward movement of the tool.

Another object of the present invention is to provide a tool as characterized above which is capable of firmly gripping the wire to be bonded, so that maximum energy transfer will result between the wire and the substrate or any bondable metallic surface.

A further object of the present invention is to provide a tool as characterized above which is formed with a generally concave bonding surface which will grip and partly straddle the wire to insure that it remains in the proper bonding location.

An even further object of the present invention is to provide a bonding tool as characterized above which is so constructed as to enable the operator to have a maximum view of the target area and wire adjacent the bonding surface of the tool.

Another object of the present invention is to provide a tool as characterized above which is rugged and dependable in operation, and which is capable of making a plurality of successful strong bonds.

The novel features which we consider characteristic of our invention are set forth with particularity in the appended claims.

The device itself, however, both as to its organization and mode of operation, together with additional objects and advantages thereof, will best be understood from the following description of specific embodiments when read in connection with the accompanying drawings, in which.

Like reference characters indicate corresponding parts throughout the several views of the drawing.

Figure 1:
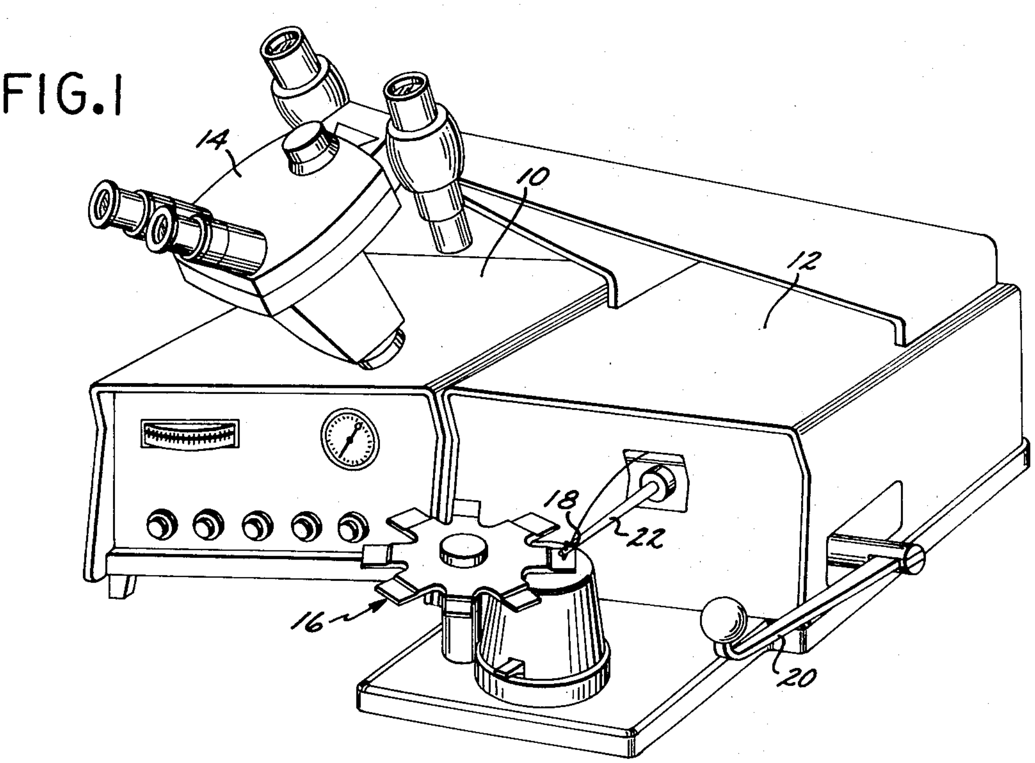
FIG. 1 is a perspective view of a bonding machine having a bonding tool according to the present invention.

Referring to FIG. 1 of the drawings, there is shown therein a bonding machine comprising cabinets 10 and 12 for housing the necessary electronic equipment, and special microscope viewing means 14 for enabling the operator to see the work being performed by the bonding machine.

The work pieces or substrates are mounted, on the machine shown in FIG. 1, on a turret substrate holder 16, and the operator moves the bonding tool 18 over the substrate by proper manipulation of handle 20. The tool 18 is mounted in a tool holder 22 which may be caused to vibrate as in the case of ultrasonic bonding, or heat may be applied directly to the wire as in the case of thermal-compression bonding.

Figure 2:
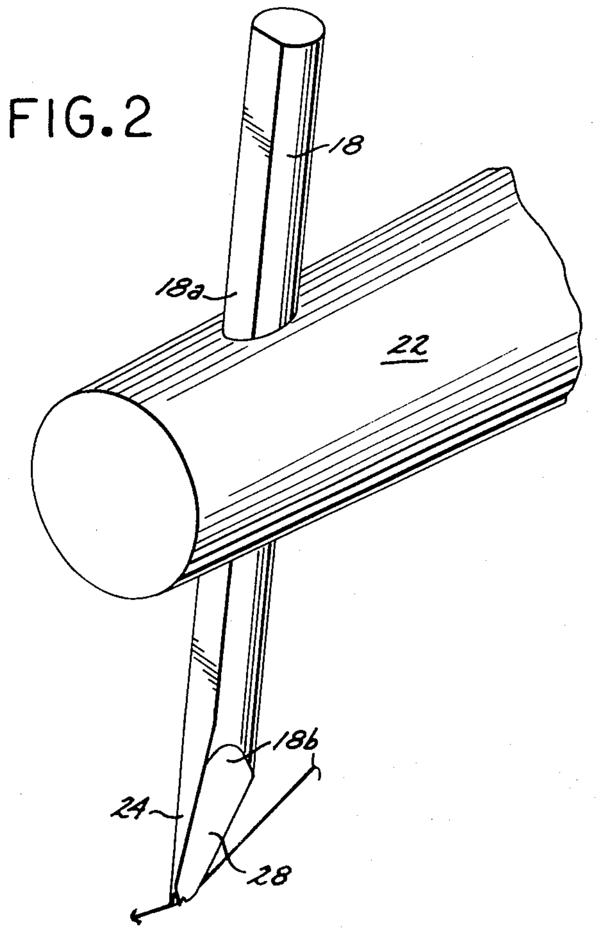
FIG. 2 is a fragmentary perspective view of the tool holder and tool of FIG. 1.
Figure 3:
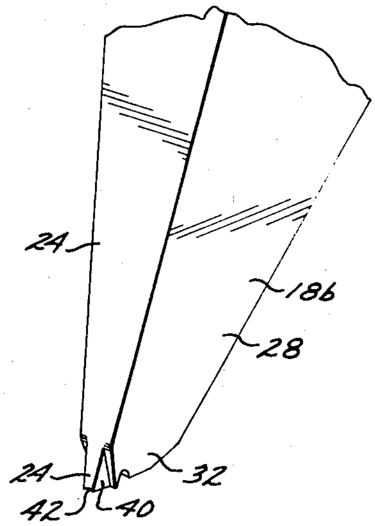
FIG. 3 is a fragmentary perspective view of the work portion of the tool of FIG. 2.

The tool 18 and a portion of tool holder 22 are shown enlarged in FIG. 2 of the drawings. The tool itself is usually formed of hard materials like tungsten carbide and is made from generally cylindrical stock. The upper portion **18*a* of the tool is adapted to be held in the tool holder 22, and the lower or work portion 18b of tool 18** is formed with the bonding portion as will hereinafter become more apparent.

The work portion **18*b* of body 18 is formed with a generally vertical flat forward wall 24 and generally tapered side walls 26 and 28, and a generally tapered rear wall 30. The rear wall 30, at its lower-most end, terminates in a guide portion 32 having a through opening 34. The end of opening 34 adjacent rear wall 30 is flared or enlarged as at 36 to facilitate insertion of the fine wire into the guide opening 34**.

A transverse cutout 38 in the bottom of tool 18 divides the work portion **18*b* of the tool into the guide portion 32 and a bonding portion 40, the latter of which is on the forward portion of the tool, adjacent the vertical forward wall 24**.

Figure 4:
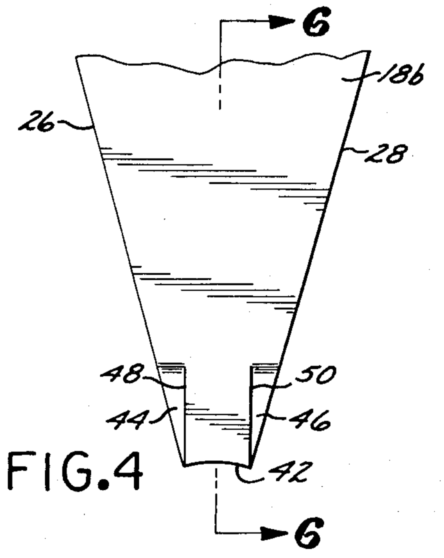
FIG. 4 is a fragmentary front elevational view of such work portion.
Figure 6:
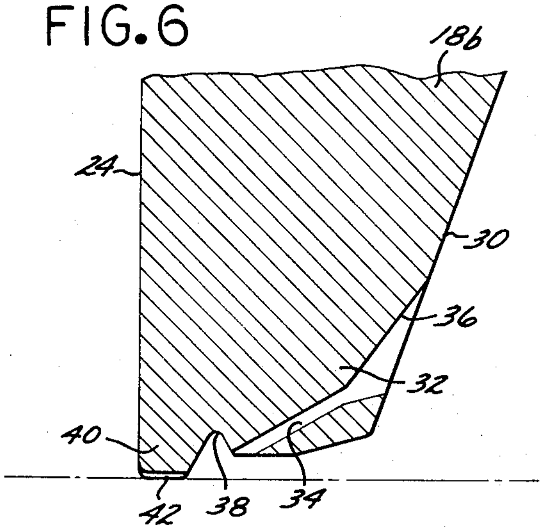
FIG. 6 is a fragmentary sectional view of such work portion, taken substantially along line 6—6 of FIG. 4 of the drawings.
Figure 8:
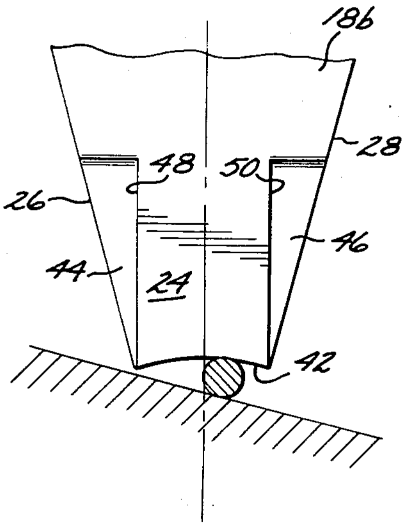
FIG. 8 is a fragmentary front elevational view of such tool in operation.

As shown most clearly in FIGS. 4, 6 and 8, the bonding portion 40 is formed with a concave or arcuate bonding surface 42. Such surface is generally cylindrical in nature, the arcuate configuration being in parallel planes which extend transversely of the tool itself. That is, as shown in FIGS. 4 and 8 of the drawings, each of said figures being a front elevational view of the work portion **18*b*** of the tool, the arcuate nature extends transversely and such surface is generally straight from front to back of said tool.

The arcuate nature of the bonding surface 42 enables the tool to apply greater compression to the wire on the substrate or metallic surface without causing the wire to be forced from under the tool. That is, the arcuate nature of the surface not only grips and holds the wire, but actually straddles the wire so that the wire is not caused to slide sideways from under the tool.

Figure 7:
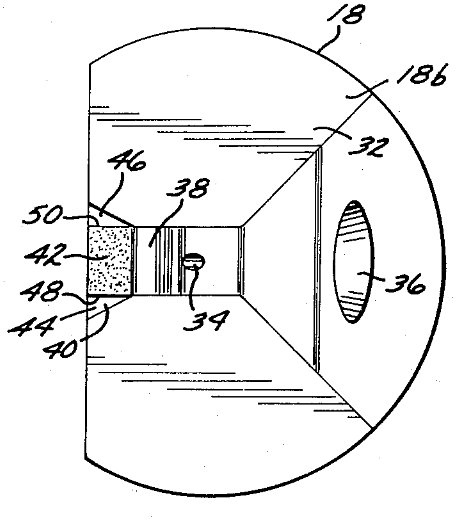
FIG. 7 is a bottom plan view of the tool.

As shown most clearly in FIG. 7 of the drawings, the bonding surface 42 is made irregular to further enhance the gripping of the wire. That is, such surface 42 is provided with a matte finish so that the surface is irregular rather than smooth and uninterrupted. Due to the fact that the wire is provided with a generally regular or even surface, the surface 42 is preferably irregular to more firmly grip such wire.

It has been found that the tool itself, in order to withstand the various forces applied to it, and to be able to transmit ultrasonic vibrations or compressive forces to the wire, should be made of relatively large husky stock. It is for this reason that the side walls 26 and 28 and rear wall 30 are tapered down to the bonding portion of the tool, so that the working portion of the tool is very small while the body of the tool remains large. However, the use of a relatively large tool body causes the view of the work operation to be obliterated or blocked from the operator.

Figure 5:
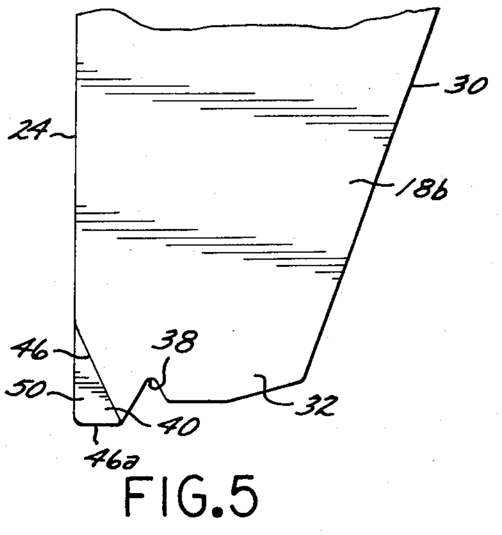
FIG. 5 is a fragmentary side elevational view thereof.

To permit the operator to see what is happening at the bonding surface, the subject tool has been provided with a pair of view reliefs 44 and 46. As shown in FIG. 5 of the drawings, such reliefs or cutouts are generally triangular in shape, the lower-most edge of such shape, as shown at **46*a*, extending the entire length of the bonding surface 42. This enables the operator to have a view of the target area and the wire immediately adjacent the bonding surface itself. Such triangular reliefs afford substantially flat parallel side walls 48 and 50** for the bonding portion of the tool. The triangular nature of the reliefs or cutouts preserves the strength of the working portion of the tool body so that the vibrations and forces are transmitted to the wire without resulting in harmful effects on the tool itself.

It is thus seen that the present invention provides a bonding tool for use in either ultrasonic or thermal-compression bonding which has an arcuately-shaped bonding surface which is provided with a matte or irregular finish for firmly gripping and holding the wire to be bonded. Also, such tool is provided with view relief cutouts to enable the operator to view completely the bonding operation.

Although we have shown and described certain specific embodiments of our invention, we are fully aware that many modifications thereof are possible. Our invention, therefore, is not to be restricted except insofar as is necessitated by the prior art.

We claim:

1. A bonding tool for placing and holding a fine wire against a metallic surface during application of energy thereto comprising in combination, a tool body having work portion and a portion adapted to be connected to a holder, said work portion being formed with a concave surface whose concave shape is along planes at right angles to the wire being bonded, an irregular finish on said surface to firmly grip said fine wire, and oppositely disposed view reliefs in said work portion, each of said reliefs providing a flat generally triangular side wall to said work portion to permit viewing the target area on said metallic surface at the bond during targeting and bonding operation of said tool.

2. A bonding tool for placing and holding a fine wire against a metallic surface during application of energy thereto according to claim 1, wherein each of said triangular side walls has an edge extending along and adjacent said bonding surface to afford maximum viewing of said targeting area.

3. A bonding tool for placing and holding a fine wire against a metallic surface during application of energy thereto according to claim 2, wherein said tool further comprises a rearward portion formed with a through opening for guiding wire to said bonding surface.

4. A bonding tool for placing and holding a fine wire against a metallic surface during application of energy thereto according to claim 3, wherein said bonding surface is cylindrical and is formed with an irregular surface for firmly gripping the wire.

5. A bonding tool for placing and holding a fine wire against a metallic surface during application of energy thereto according to claim 4, wherein said tool body is formed with a substantially flat vertical forward wall and generally tapered sides and rear walls, said rear wall terminating at its lower end in said rearward portion having said opening for guiding the wire.

6. A bonding tool for placing and holding a fine wire against a metallic surface during application of energy thereto according to claim 5, wherein said forward wall terminates at said bonding surface and each of said side walls thereat is formed with one of said view reliefs adjacent said bonding surface.

* * * * *